United States Patent [19]

Gagliardi et al.

[11] Patent Number: 6,143,148

[45] Date of Patent: Nov. 7, 2000

[54] DEVICE FOR FEEDING SUBSTRATES TO VACUUM SYSTEMS FOR DEPOSIT OF SURFACE COATING ON THE SUBSTRATES

[75] Inventors: Giovanni Gagliardi, Conselice; Luigi Corvino, San Salvo, both of Italy

[73] Assignee: Societa' Italiana Vetro-Siv-S.p.A., San Salvo, Italy

[21] Appl. No.: 08/971,905

[22] Filed: Nov. 17, 1997

[30] Foreign Application Priority Data

Feb. 3, 1997 [IT] Italy .................................. RM97A0051

[51] Int. Cl.[7] .................................................. C23C 14/00
[52] U.S. Cl. .............................. 204/298.26; 204/298.02; 204/298.03; 204/298.27; 204/192.1; 118/719; 118/729
[58] Field of Search .................. 204/298.02, 298.03, 204/298.26–298.27, 192.1; 118/719, 729

[56] References Cited

U.S. PATENT DOCUMENTS

| | | | |
|---|---|---|---|
| 4,015,558 | 4/1977 | Small et al. ................................ | 118/6 |
| 5,126,027 | 6/1992 | Kudo et al. ........................ | 204/192.13 |
| 5,215,420 | 6/1993 | Hughes et al. ........................... | 414/217 |
| 5,538,560 | 7/1996 | Zejda et al. ............................... | 118/730 |
| 5,683,561 | 11/1997 | Hollars et al. ........................... | 204/298 |
| 5,741,405 | 4/1998 | Statnikov et al. .................. | 204/192.14 |
| 5,784,799 | 7/1998 | Kato et al. .................................... | 34/92 |
| 5,863,338 | 1/1999 | Yamada et al. ......................... | 118/719 |

FOREIGN PATENT DOCUMENTS

WO 97/06287  2/1997  WIPO .

*Primary Examiner*—Yogendra Gupta
*Assistant Examiner*—Derrick G. Hamlin
*Attorney, Agent, or Firm*—Wenderoth, Lind & Ponack, L.L.P.

[57] ABSTRACT

A process for supplying plants for the coating of substrates involves introducing the substrates batchwise into the vacuum plant and, subsequently, dividing said batches into single substrates in order to allow recovery of the unsaturation percentage, which is connected to the method used to feed in the batch.

The device suitable to provide this process is made up of transport sections capable of giving the substrates forming the batch different speeds from one another, so as to separate them and line them up, with a pre-set constant spacing, in a continuous line of substrates feeding the process chambers (B3, C3).

20 Claims, 3 Drawing Sheets

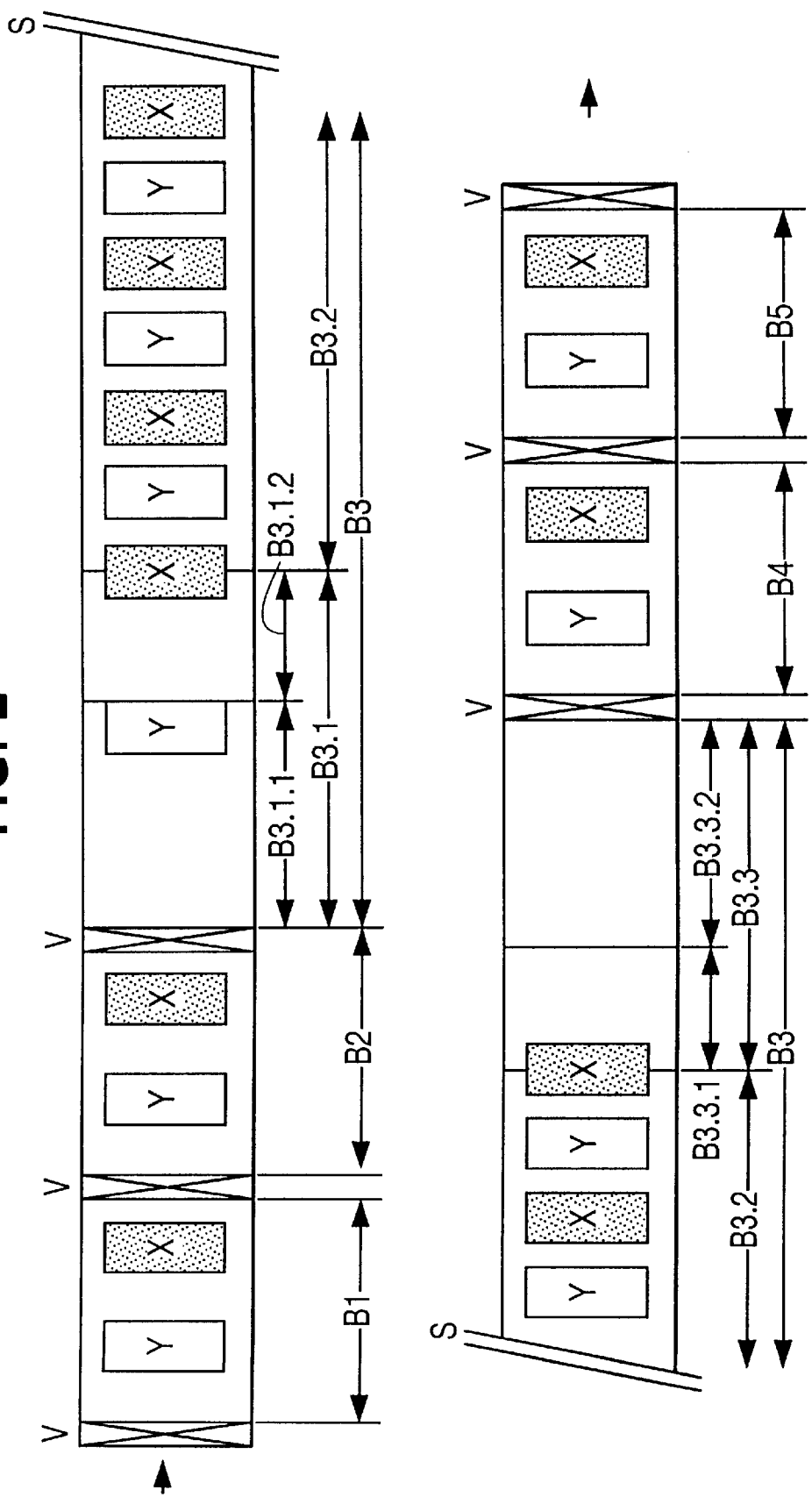

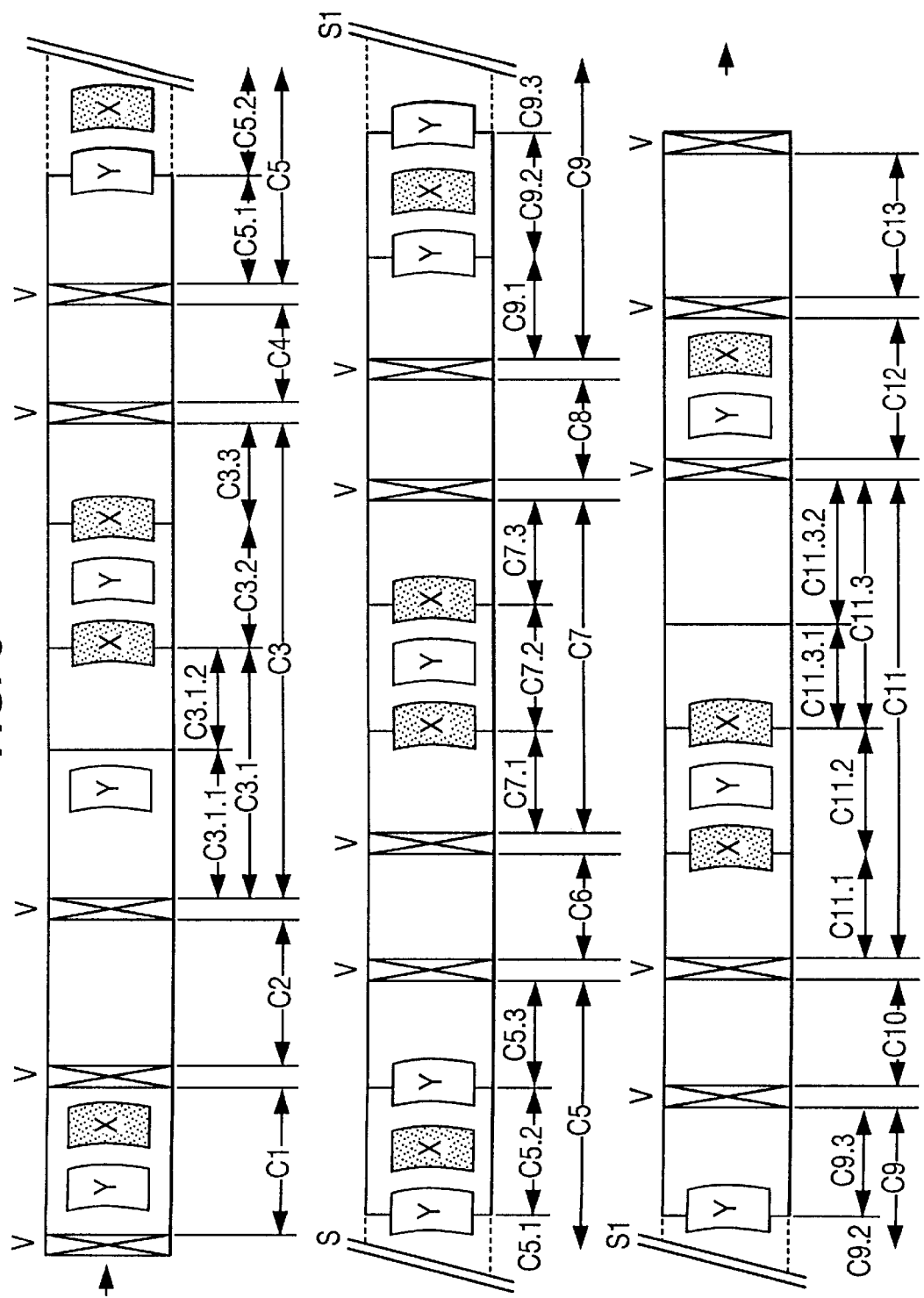

DEVICE FOR FEEDING SUBSTRATES TO VACUUM SYSTEMS FOR DEPOSIT OF SURFACE COATING ON THE SUBSTRATES

BACKGROUND OF THE INVENTION

1. Field of the invention

The present invention relates to a process and a device for supplying and transporting flat and curved substrates of whatever shape (made of material such as glass or plastic) into industrial vacuum systems for application of surface coatings on the substrates.

2. Description of the Prior Art

These systems can be designed according to two distinct operating concepts that are realized into so-called in-line and oscillating systems respectively, with the substrates positioned horizontally or vertically.

The in-line type systems are characterised by the fact that the various stages of the process take place in a continuous manner as the substrates are transferred through the various coating areas.

In the oscillating type systems, on the other hand, there is a single coating area, and the substrates are moved through this in both directions with an alternating straight movement. The process is stopped at the end of each passage of the substrates through the coating area, in order to set up the system for the next coating operation.

In both cases, feeding of the substrates into the system is carried out using the batch principle. This principle consists of positioning a suitable number of substrates on the loading surface and then introducing them all together into the system. The group of substrates formed in this way is passed through all the subsequent stations in the system in order to undergo the coating process, without modification, until reaching the unloading point.

In order to clarify the description of the present invention, among the many possible applications the one that will be taken into consideration here, without in any way limiting the use of the invention itself, relates to the feeding and transport of substrates of flat/curved/shaped glass through vacuum systems, and in particular that in industrial plants for deposit of transparent and/or non-transparent thin layers using the technology known in the art as magnetotronic sputtering, in all its various constructional embodiments.

In the following description the word coating is used to indicate one or more thin layers applied to the substrate.

The technical solution based on the batch principle is only optimal when processing single sheets of a size equal to that of the working loading area.

In reality it is also necessary to coat sheets of glass of smaller size and with different geometrical shapes (for example triangles, trapeziums, semicircles, etc.). In these cases the average saturation of the loading surface can be lower than the optimum value by a level of around 30 percent or more, which thus causes a loss of production capacity of the same amount.

Setting aside the concept of batch feeding, there are a number of transport systems that are generally used.

For example, in the case of flat substrates a roller and/or belt conveyor is used, while for curved substrates a creeper or carriage conveyor is used.

All the above mentioned conveyor systems in no way make it possible to avoid a lack of saturation in the batch itself.

Of the two type of systems mentioned above, the in-line solution is normally used in plants working flat substrates.

For curved substrates, oscillating systems are preferred, as the creation of an in-line type system for curved substrates based on the batch feeding concept involves the following problems:

- excessive length of the line, as a result of the need to separate the process gasses used in the various deposition areas with units of three chambers, two transfer chambers and one isolation chamber, of a working length equivalent to that of the batch
- high investment costs for purchase of the system
- low saturation of the loading area, with a consequent loss of production capacity
- high level of surface pollution in the process chambers by the material being deposited.

As mentioned above, the batch feeding system causes a decrease in the production capacity when the substrates are of a size lower than the maximum area of the loading surface. This is so regardless of the conveyor system used (both horizontal and vertical conveyors, roller beds, belt conveyors, creepers) and the type of system (in-line or oscillating).

For example, let us consider a sputtering system with a working width of 2000 mm and with a loading area of 2000 mm×3000 mm, for coating of glass substrates.

In the case of flat sheets of glass, using a roller conveyor system it is possible, for example, to load up to a maximum of 3 sheets with a height of 960 mm each, taking into account a minimum spacing of 40 mm between sheets. If sheets of a greater height must be processed, for example sheets of 970 mm, it will only be possible to house two sheets per batch, with a loss in saturation of the loading surface of 31.3 percent, which in this way gives a drop in saturation of from 96% to 64.7%, with a corresponding drop in production capacity.

In the case of curved sheets of glass, using a carriage conveyor system, the structure supporting the pieces, which is formed on the carriages themselves, requires a greater distance between sheets, so that saturation of the loading area is further reduced. In this case it would be possible, for example, to house up to a maximum of 3 sheets with a height of 900 mm on the same carriage (=load). If the height of the sheets rises, for example, to 910 mm, it will only be possible to position two sheets per carriage, with a loss in saturation of the loading area of 29.3 percent (from 90% to 60.7%) and an equivalent loss in production capacity.

In the case of curved sheets of glass using a creeper transport system, the saturation levels would be the same as those indicated for flat glass on a roller conveyor.

SUMMARY OF THE INVENTION

The object of the present invention is to provide a process and a device for feeding vacuum systems for deposition of surface coatings on substrates that solves the problems mentioned above.

In fact the present invention makes it possible to eliminate the problems of unsaturation, by transforming the batchwise feeding system into a continuous feeding of one substrate after another, at a suitably pre-set constant spacing, regardless of the height of the substrate itself.

Continuous feeding, at a suitably pre-set constant spacing, according to the process of the present invention is obtained by moving the single sheets of glass in the batch one at a time.

In particular the system transfers the first sheet of glass in the batch, at a suitable speed, and positions it after the last sheet of glass from the preceding batch, which has already entered or is entering the coating station, at a suitable pre-set constant spacing distance, recovering in this way the empty space that would be left between the two adjacent batches due to the lack of saturation on the loading surface. The cycle continues in this way for the remaining substrates, thus also recovering the empty spaces between two adjacent sheets of glass in the same batch, until the last sheet of glass in the batch is transferred, and the system is ready to receive the new batch that has been prepared in the meantime upstream.

On leaving the last coating area the process is repeated in reverse, using the same procedure, taking up the single substrates from the continuous flow of substrates leaving the machine so as to re-form the batch.

The batch will then be transferred in a discontinuous manner to the outside of the vacuum system.

The present invention can be applied both to systems that have been designed to process flat substrates and those designed to process curved substrates. The advantages given by use of the present invention will be particularly obvious when it is necessary to obtain a high productivity system for coating of curved substrates.

For example, when compared with in-line systems for curved sheets of glass using a carriage conveyor system, the following additional advantages are obtained by application of the present invention:

reduction in the pollution of the surfaces in the coating chambers with the deposition material, due to the high level of unsaturation of the loading area (this is also the case with a creeper conveyor system)

reduction of the total width of the line (this is also the case with a creeper conveyor system)

lower investments required for creation of the plants (this is also the case with a creeper conveyor system)

elimination of manual operations to load and unload the sheets of glass from the carriages increased productivity for plant operators elimination of carriage maintenance costs and those relating to the manpower required to set up the supports on the carriages whenever there are changes in production.

The object of the present invention is therefore a process for feeding vacuum plants for the deposit of surface coatings on substrates, the plants are made up of a succession of at least one intake transport chamber B1, B2, C1, C2, at least one process chamber B3, C3 and at least one outlet transport chamber B4, B5, C12, C13, in which the feeding of the substrates X, Y into the plant takes place by means of a succession of single batches made up of a pre-set number of the substrates, the number is dependent on the dimensions of the substrate and of the working loading area of the transport chamber. Following the intake transport chambers, the single batch is transformed into a succession of single substrates separated from each other by a pre-set constant spacing regardless of the dimensions of the substrates themselves and of the working loading area of the transport chambers.

The invention furthermore consists of a device for feeding vacuum plants for deposit of surface coatings on substrates X, Y. The plants comprise a succession of at least one intake transport chamber E1, B2, C1, C2, at least one process chamber B3, C3 and at least one outlet transport chamber B4, B5, C12, C13, which are equipped with horizontal or vertical moving devices to move the substrates themselves. The moving devices comprise at least one transport means B3.1, C3.1 having a first section B3.1.1, C3.1.1 and at least one consecutive section B3.1.2, C3.1.2 capable of operating at different speeds, so as to give the single substrates a speed that will allow them to be separated from the batch and lined up one behind the other at a constant pre-set distance from each other and from the series of single substrates that precedes them.

BRIEF DESCRIPTION OF THE DRAWINGS

Further characteristics and advantages of the present invention will be clear from the following description, which is given merely as a non-limiting example, with reference to the enclosed drawings, in which:

FIG. 2 shows the plan of a plant for deposit of coatings on flat sheets of glass, formed according to the present invention; and FIG. 3 shows the plan of a similar plant formed according to the invention for coating of curved sheets of glass.

DETAILED DESCRIPTION OF THE INVENTION

Figure 1:
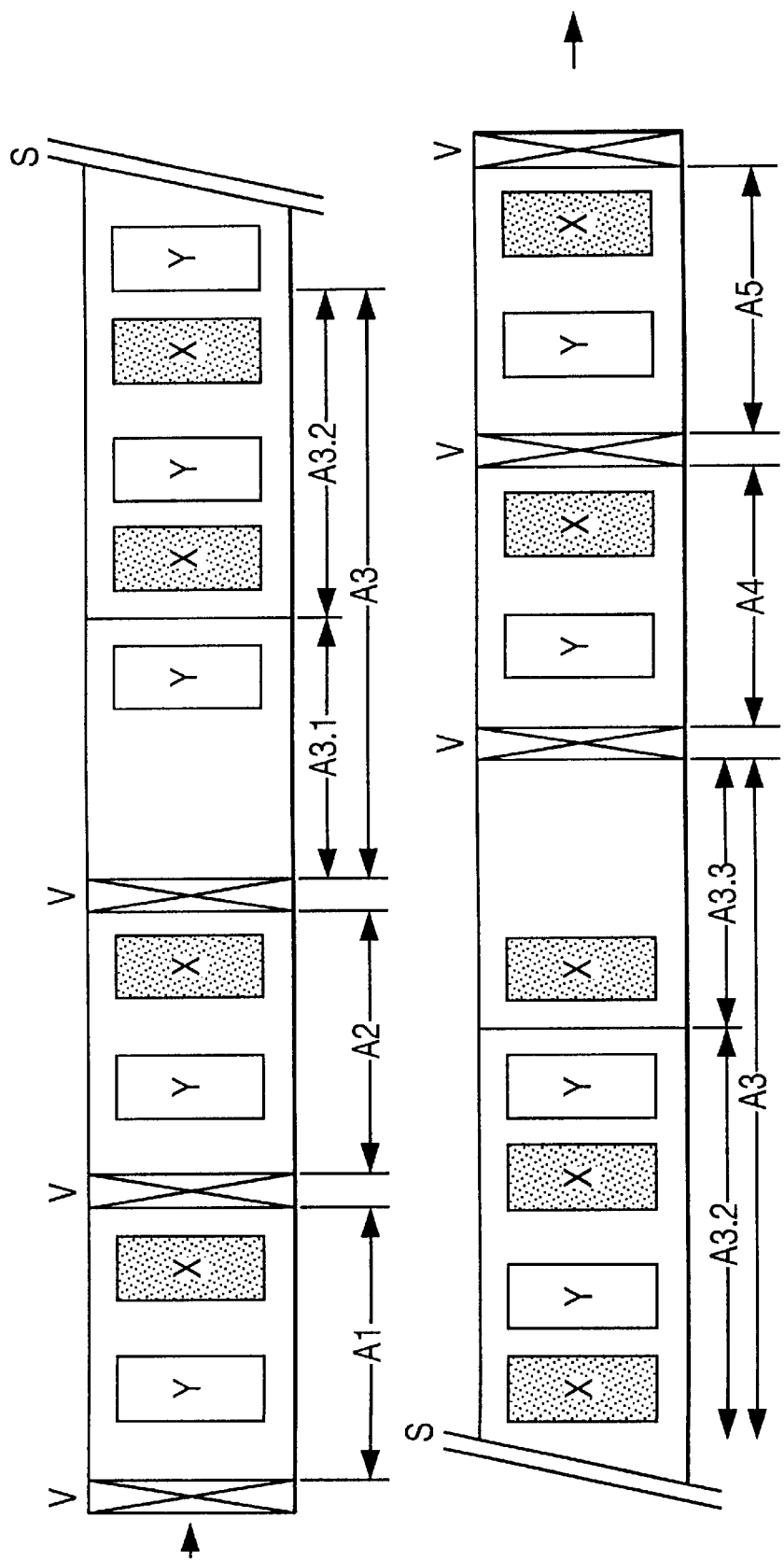
FIG. 1 represents the plan of a plant formed according to the state of the art.

For the sake of convenience, the entrance chambers, storage chambers and outlet chambers will be generally indicated as transfer chambers, while the transfer/sputtering/transfer chambers and the isolation chambers will be generally termed process chambers.

In the following description (A), and with reference to FIG. 1, the feeding and transport system of a horizontal sputtering plant of the in-line type is illustrated for flat substrate coating operations.

Let us say that the plant is made up of five vacuum chambers, made independent of one another by means of suitable valves V, an entrance chamber A1, a storage chamber A2, a transfer/sputtering/transfer chamber (also known as a process chamber) A3, a second storage chamber A4 and an outlet chamber A5. The central chamber A3 is made up of a first transfer area A3.1, a coating area A3.2 and a second transfer area A3.3. The size of the batch is taken to be 2000 mm×3000 mm, as the working width of the plant is 2000 mm. Consequently the entrance chamber A1, the storage chambers A2 and A4 and the outlet chamber A5 will have a working loading length of 3000 mm. Assuming, for example, that it is necessary to process substrates with dimensions of 970 mm×2000 mm, in this case only two sheets of glass, indicated here as X and Y, will be present on the effective loading surface, giving a saturation of the loading area equal to 64.7%.

When the entrance chamber A1 is fed with the batch n, and the technological operations for creating the vacuum have been carried out in the same chamber, the batch is transferred at high speed (with respect to the process speed), for example 30 m/min, into the storage chamber A2 as soon as the preceding batch n−1 preceding it has been transferred, likewise at high speed, into the first transfer area A3.1 of the central chamber A3, from which the batch n−2 has been completely transferred at process speed, for example 2 m/min, into the coating area A3.2. The batch n in the storage chamber A2 will be transferred at high speed into the first transfer area A3.1 after the batch n−1 preceding it has been completely transferred at the process speed into the coating area A3.2. This high speed transfer makes it possible to achieve continuous feeding of one batch after another into the coating area, at a constant pre-determined spacing, without however eliminating the lack of saturation found in each batch, a lack of saturation that will therefore still be present in the coating area. At the same time the entrance chamber A1 will have been ventilated and fed with the next batch n+1 and the cycle will be repeated.

According to the present invention and with reference to FIG. 2 the following is a description (B) of application of the present invention in the case of an in-line type horizontal sputtering system for deposit of thin layers on flat sheets of glass.

Merely as an example, a system of this kind is here considered to be made up of five vacuum chambers, made independent of each other by means of suitable valves V, an entrance chamber B1, a storage chamber B2, a transfer/sputtering/transfer chamber B3 (also indicated in the following as the process chamber), a second storage chamber B4 and an outlet chamber B5.

The central chamber B3 is made up of a first transfer area B3.1, a coating area B3.2 and a second transfer area B3.3. It is likewise assumed, merely as an example, that processing of substrates with a maximum width equal to the working width of the system, that is to say 2000 mm, is to take place at a line processing speed of 2 m/min. The dimensions of the batch are taken to be 2000 mm×3000 mm (the necessary length will be defined case by case according to the minimum cycle times foreseen for the plant). Consequently the entrance chamber B1, the storage chambers B2 and B4 and the outlet chamber D5 will have a working loading length of 3000 mm. The first transfer area B3.1 in the central chamber will be made up of two independent transport units, the first B3.1.1 of a length at least equal to that of the batch, the second B3.1.2 of a length at least equal to the maximum height of the substrates to be processed.

Once the working loading surface of the entrance chamber B1 has been loaded with the batch of substrates, indicated here with X and Y, and the vacuum has been created, the batch is transferred at high speed (with respect to the process speed), for example 30 m/min, into the adjacent storage chamber D2 and then sent at high speed into the first transport unit B3.1.1 with the first substrate abutting onto the end thereof. From here, the substrates in the batch will be transferred one at a time at high speed to the second transport unit B3.1.2, from which they will be transferred at processing speed, for example at 2 m/min, into the coating area D3.2. In particular, using special substrate identification systems and systems controlling the speed and acceleration of the moving devices, each substrate in the batch will be suitably slowed down or stopped at the end of the second transport unit B3.1.2 behind the substrate preceding it, before being transferred at processing speed into the coating area B3.2 in such a way that between said two substrates a distance equivalent to the pre-set spacing is formed, for example 40 mm. At the same time the remaining substrates in the transfer unit B3.1.1 will be moved at high speed until the first of them abuts on the end of the unit itself. During the transfer of each substrate at processing speed from the second transfer unit B3.1.2 into the coating area B3.2, the substrates in the first transfer unit B3.1.1 can, after the abutting stage described above and if necessary, be moved at the same time in a block and made to advance at the processing speed until the substrate leaving the transfer unit B3.1.2 has completely left the unit in question. At this point the two transfer units B3.1.1 and B3.1.2 will be moved at high speed to repeat the abutting and transfer operations described above, respectively.

In a similar manner the system will transfer all the substrates from the batch in B3.1 into the coating area B3.2, with a suitably pre-set constant spacing, thus guaranteeing a constant supply of substrates and at the same time also recovering any empty spaces that might be found between two adjacent substrates in the same batch. As the first transfer unit B3.1.1 disengages with the last substrate in the batch in question, the following batch, which was previously transferred from the entrance chamber B1, will be moved from the storage chamber B2, and the cycle starts again.

At the exit from the coating area B3.2, the second transfer area B3.3 is made up of two independent transport units, the first one, B3.3.1, having a length at least equal to the maximum height of the substrates to be processed, and the second one B3.3.2 having a length at least equal to the length of the batch.

The substrates leaving the coating area B3.2 will be transferred one at a time at high speed to the second transport unit B3.3.2, re-forming the batch, which will in turn be sent into the second storage chamber B4 before being passed out of the plant through the outlet chamber B5. In particular, using special substrate identification systems and systems for control of the speed and acceleration of the moving device, as soon as each substrate has been fully transferred at the processing speed out of the coating area B3.2 into the first transport unit B3.3.1, the substrate will be transferred at high speed into the second transport unit B3.3.2 and stopped as soon as it has disengaged with the unit B3.3.1. In order to re-form a batch containing the same number of substrates found in the batches upstream of the machine (or one containing the maximum possible number of substrates), and according to the pre-set distance between the substrates, the transfer unit B3.3.2 will be moved each time with a certain delay with respect to the unit B3.3.1.

Let us briefly analyse, in the form of an example, the main advantages that derive from use of the device according to the present invention, by comparison of the plants described above (A and B). This comparison, which is made possible by the fact that in both cases identical batches have been purposely taken into consideration, underlines the different levels of saturation that can be obtained in the coating areas, even when starting from the same initial saturation level in the loading area.

Similarly to the manner described above (A), let us assume that it is necessary to process substrates with dimensions 970 mm×2000 mm. In this case, only 2 substrates will be present on the loading surface, giving a saturation level of 64.7%.

In the first case (A) this saturation level would remain unchanged in the coating area, whereas in the second case considered (B), as continuous feeding of the substrates is guaranteed irrespective of their height at a constant pre-set spacing, for example 40 mm, the saturation in the coating area will rise by 32.3 percent (from 64.7% to 97%). This increase in the saturation level will result in an equivalent increase in the production capacity of the plant itself.

As a further example let us suppose it to be necessary to process substrates with a height of 400 mm and a width of 2000 mm. In this case, with a minimum spacing between one sheet and the next of 40 mm, there will be 6 substrates on the loading area, giving an overall saturation level of 80%. Use of the device according to the present invention will in this case allow an increase in the saturation level in the coating area of 12 percent (from 80% to 92%).

According to the present invention, and with reference to FIG. 3, an application (C) is described in a high capacity, in-line horizontal sputtering plant for deposit of thin layers on curved sheets of glass.

Merely as an example, let us take a system made up of thirteen (13) vacuum chambers, made independent of one another by means of suitable valves V, one entrance chamber C1, one storage chamber C2, one transfer/coating/transfer chamber C3, one separation chamber C4, three pairs of chambers each one made up of a coating chamber and a separation chamber, respectively indicated as C5 and C6, C7 and C8, C9 and C10, a second transfer/coating/transfer chamber C11, a storage chamber C12 and an outlet chamber C13.

A similar plant configuration would, for example, allow high transparency double-layer silver coating operations, used to control solar and thermal radiation.

The presence of the above mentioned separation chambers C4, C6, C8 and C10, with a length at least equal to the maximum height of the substrates to be coated, is indispensable in the case of a plant, such as the one taken into consideration, that is designed to process highly curved substrates, in order to guarantee isolation of the various process gasses used in the various coating areas within chambers C3, C5, C7, C9 and C11.

The first transfer/coating/transfer chamber C3 (also indicated in the following as process chamber) is made up of a first transfer area C3.1, of a coating area C3.2 and of a second transfer area C3.3. It is likewise supposed, again merely as an example, that the processing is to be carried out at a line speed of 2 m/min on substrates with a maximum width equivalent to the working width of the plant, that is to say 2000 mm.

The dimensions of the batch are taken to be 2000 mm×3000 mm (the necessary length will be defined case by case according to the minimum cycle times foreseen for the plant). Consequently, the entrance chamber C1, the storage chambers C2 and C12 and the outlet chamber C13 will have a working length of 3000 mm. The first transfer area C3.1 in the first transfer/coating/transfer chamber C3 will be made up of two independent transport units, the first of these, C3.1.1, having a length at least equal to that of the batch, the second, C3.1.2, having a length at least equal to the maximum height of the substrates to be processed.

Once the entrance chamber C1 has been filled with the batch of substrates, indicated here as X and Y, and the vacuum has been created, the batch is transferred at high speed (with respect to the process speed), for example 30 m/min, into the adjacent storage chamber C2 and then sent at high speed into the first transport unit C3.1.1 with the first substrate abutting onto the end thereof.

From here, the substrates in the batch will be transferred one at a time at high speed to the second transport unit C3.1.2, from which they will be transferred at processing speed, for example at 2 m/min, into the coating area C3.2. In particular, using special substrate identification systems and systems controlling the speed and acceleration of the moving devices, each substrate in the batch will be suitably slowed down or stopped at the end of the second transport unit C3.1.2 behind the substrate preceding it, before being transferred at processing speed into the coating area C3.2 in such a way that between the two substrates a distance equivalent to the pre-set spacing is formed, for example 40 mm. At the same time the remaining substrates in the transfer unit C3.1.1 will be moved at high speed until the first of them abuts on the end of the unit itself.

During the transfer of each substrate at processing speed from the second transfer unit C3.1.2 into the coating area C3.2, the substrates in the first transfer unit C3.1.1 can, after the abutting stage described above and if necessary, be moved at the same time in a block and made to advance at the processing speed until the substrate leaving the transfer unit C3.1.2 has completely left the unit in question. At this point the two transfer units C3.1.1 and C3.1.2 will be moved at high speed to repeat the abutting and transfer operations described above, respectively.

In a similar manner the system will transfer all the substrates from the batch in C3.1 into the coating area C3.2, with a suitably pre-set constant spacing, thus guaranteeing a constant supply of substrates and at the same time also recovering any empty spaces that might be found between two adjacent substrates in the same batch. As the first transfer unit C3.1.1 disengages with the last substrate in the batch in question, the following batch, which was previously transferred from the entrance chamber C1, will be moved from the storage chamber C2, and the cycle starts again.

The second transfer area C3.3, at the exit from the coating area C3.2, is made up of a transport unit of a length at least equal to the maximum height of the substrates to be processed.

The substrates leaving the coating area C3.2 will be transferred one at a time at high speed into the separation or isolation chamber C4. In particular, using special substrate identification systems and systems for control of the speed and acceleration of the moving devices, as soon as each substrate leaving the coating area C3.2 has been fully transferred at processing speed into the second transfer area C3.3, it will be transferred at high speed into the isolation chamber C4. From here, after the technological operations required to guarantee isolation of process gasses between chambers C3 and C5, the substrate will be transferred at high speed into the chamber C5, which is made up of a first transfer area C5.1, a coating area C5.2 and a second transfer area C5.3, the length of the above two transfer areas being at least equal to the maximum height of the substrates to be processed.

In particular, using special substrate identification systems and systems controlling the speed and acceleration of the moving devices, the substrate will be suitably slowed down or stopped at the end of the first transfer area C5.1 behind the substrate that precedes it, and will then be transferred at processing speed into the coating area C5.2 so that the two substrates mentioned above are set at a distance equivalent to the pre-set spacing, for example 40 mm, in this way guaranteeing continuous feeding of substrates below the coating area in question.

The substrates leaving the coating area C5.2 will be moved through chambers C6, C7 and C8, C9 (with a similar structure to chambers C4 and C5) as described above for the coating area C3.2. It is therefore sufficient to describe transfer of the single substrates from the isolation chamber C10 onward.

The second transfer/coating/transfer chamber C11 is made up of a first transfer area C11.1, a coating area C11.2 and a second transfer area C11.3. The second transfer area C11.3 is made up of two independent transport units, the first one, C11.3.1, having a length at least equal to the maximum height of the substrates to be processed, the second one, C11.3.2, having a length at least equal to that of the batch.

After the technical operations necessary to guarantee isolation of the process gasses between chambers C9 and C11, each substrate will be transferred at high speed from chamber C10 to chamber C11.

In particular, using special substrate identification systems and systems controlling the speed and acceleration of the moving devices, the substrate will be suitably slowed down or stopped at the end of the first transfer area C1.1 behind the substrate that precedes it, and will then be transferred at processing speed into the coating area C11.2 so that in this final area also there is continuous feeding of substrates at a suitable pre-set spacing.

On leaving C11.2 the substrates are transferred one at a time at high speed into the second transport unit C11.3.2 to re-form the batch, which will in turn be sent to the second storage chamber C12 before being transferred to the outside of the plant through the outlet chamber C13.

In particular, using special substrate identification systems and systems controlling the speed and acceleration of the moving devices, as soon as each single substrate has been fully transferred at processing speed out of the deposition area C11.2 onto the first transport unit C11.3.1, it will be transferred at high speed to the second transport unit C11.3.2 and stopped as soon as it disengages with the unit C11.3.1.

In order to re-form a batch containing the same number of substrates as that upstream of the machine (or one containing the maximum possible number of substrates), and according to the distance required between substrates, the transfer unit C11.3.2 will be put into motion each time with a suitable delay with respect to the unit C11.3.1.

Although the invention has been described with reference to several preferred embodiments thereof, it is understood that variations and modifications can be made thereto without departing from the scope of the invention itself.

What is claimed is:

1. A vacuum system for applying surface coatings on substrates that are received in batches, said system comprising:

an inlet chamber;

a first storage chamber;

a process chamber having an inlet end and an outlet end and having a first transfer area at the inlet end thereof and a coating area, wherein said inlet chamber, said first storage chamber and said process chamber are disposed in sequence and have a length along a direction of transport of the substrates, each of the substrates has a height along the direction of transport thereof and a width in a direction that is transverse to the direction of transport, and the substrates can be transported at a process speed in the process area and at a higher speed along said inlet and storage chambers;

a plurality of valves for closing/opening communication between said chambers such that said chambers are isolated or in communication by actuation of said closing/opening valves, said chambers and an incoming batch of substrates;

a first transport device disposed in said first area and being operable to transport the substrates toward said coating area, said first transport device having a length at least equal to the length of the batch; and a second transport device disposed in said first area and having a length at least equal to a maximum height of the individual substrates in the batch, said second transport device being operable to transport the substrates to said coating area, said first and second transport devices being disposed in sequence in said first transfer area, each of said first and second transport areas having an inlet end and an outlet end, wherein:

an incoming batch of substrates is transferred at the higher speed from said storage chamber to said first transport area when said first transport device is empty, until the first substrate of the batch is positioned at the outlet end of said first transport device;

said first transport device is stopped until the last substrate of a preceding batch of substrates on said second transport device has left said second transport device by passing to said coating area at the lower process speed;

along said first and second transport devices the first substrate of the incoming batch is transferred at the higher speed, from the position at the outlet end of said first transport device to a position at the outlet end of said second transport device, at the same time as a trailing end of the last substrate is at a predetermined spacing from the outlet end of said second transport device, so that a predetermined spacing is established between the leading end of the first substrate of the incoming batch and the trailing end of the last substrate of the preceding batch;

while said first transport device is stopped, said first substrate is transferred at said lower process speed from said second transport device to said coating area, so as to maintain the spacing from the last substrate of the preceding batch; and all the remaining substrates of the incoming batch are similarly transferred from said first transfer area to said coating area so as to continuously feed substrates with a preset constant spacing in said coating chamber.

2. A vacuum system as claimed in claim 1, further comprising a plurality of process chambers for different vacuum processing of the substrates which are being continuously fed with a preset constant spacing, said process chambers being separated one from the other by a separation chamber.

3. A vacuum system as claimed in claim 1, further comprising identifying devices for identifying the substrates and controllers for controlling the speed and acceleration of each of the transport devices so as to provide individual control of the transport of the substrates.

4. A vacuum system as claimed in claim 1, further comprising substrate identification systems and controllers for controlling the speed of each of said first and second transport devices, wherein said first and second transport devices operate at different speeds according to signals that are transmitted from said substrate identification systems and said controllers for controlling the speed and acceleration of the transport devices.

5. A vacuum system as claimed in claim 1, wherein said first and second transport devices each comprise a roller conveyor.

6. A vacuum system as claimed in claim 1, wherein said first and second transport devices each comprise a creeper.

7. A vacuum system as claimed in claim 1, wherein said first and second transport devices each comprise a carriage conveyors.

8. A vacuum system as claimed in claim 1, wherein said first and second transport devices each comprise a belt conveyor.

9. A vacuum system as claimed in claim 1, wherein the system is an in-line plant for magnetron sputtering.

10. A vacuum system as claimed in claim 1, wherein the system is an oscillating magnetron sputtering plant.

11. A vacuum system as claimed in claim 1, wherein the substrates are flat sheets of glass.

12. A vacuum system as claimed in claim 1, wherein the substrates are curved sheets of glass.

13. A vacuum system as claimed in claim 1, wherein said process chamber further comprises a second transfer area having a second third transport device and a fourth transport device, said second transport area being disposed downstream of said coating area with respect to the direction of transport, said system further comprising a second storage chamber and an outlet chamber disposed in succession downstream of said second transfer area with respect to the direction of transport, wherein said first and second transport devices are operable to transform back the continuous output of coated substrates with a preset constant spacing into a batchwise output similar to the batchwise input of the substrates.

14. A feeding device for feeding substrates to a surface coating area of a substrate processing plant, said feeding device comprising:

a first transport device having an outlet end and an inlet end for receiving substrates in batch-form from a storage chamber of the substrate processing plant, said first transport device having a length in a transport direction that is at least equal to the length of the batch, said first transport device being operable to transport the substrates in the transport direction at a transport speed; and a second transport device having an inlet end positioned adjacent said outlet end of said first transport device for receiving substrates from said first transport device, and an outlet end from which substrates can be fed to the surface coating area, said second transport device having a length in the transport direction that is at least equal to the a maximum height of the individual substrates in the batch, said second transport device being operable to transport the substrates in the transport direction at the transport speed or at a processing speed which is lower than the transport speed, wherein:

an incoming batch of substrates is transferred at the higher transport speed to said first transport device when said first transport device is empty, until a first substrate of the batch is positioned at the outlet end of said first transport device;

said first transport device is stopped until the last substrate of a preceding batch of substrates on said second transport device has left said second transport device by passing to the coating area at the lower process speed;

along said first and second transport devices the first substrate of the incoming batch is transferred at the higher transport speed, from the position at the outlet end of said first transport device to a position at the outlet end of said second transport device, at the same time as a trailing end of the last substrate is at a predetermined spacing from the outlet end of said second transport device, so that a predetermined spacing is established between the leading end of the first substrate of the incoming batch and the trailing end of the last substrate of the preceding batch;

while said first transport device is stopped, the first substrate is transferred at the lower process speed from said second transport device to the coating area, so as to maintain the spacing from the last substrate of the preceding batch; and all the remaining substrates of the incoming batch can be similarly transferred from said second transport device to the coating area so that the substrates are continuously fed with a preset constant spacing to the coating chamber.

15. A feeding device as claimed in claim 14, further comprising identifying devices for identifying the substrates and controllers for controlling the speed and acceleration of each of said first and second transport devices so as to provide individual control of the transport of the substrates.

16. A feeding device as claimed in claim 14, further comprising substrate identification systems and controllers for controlling the speed of each of said first and second transport devices, wherein said first and second transport devices operate at different speeds according to signals that are transmitted from said substrate identification systems and said controllers for controlling the speed and acceleration of said first and second transport devices.

17. A feeding device as claimed in claim 14, wherein each of said first and second transport devices comprises a roller conveyor.

18. A feeding device as claimed in claim 14, wherein each of said first and second transport devices comprises a creeper.

19. A feeding device as claimed in claim 14, wherein each of said first and second transport devices comprises a carriage conveyor.

20. A feeding device as claimed in claim 14, wherein each of said first and second transport devices comprises a belt conveyor.

* * * * *